(12) United States Patent
Miura et al.

(10) Patent No.: US 9,171,975 B2
(45) Date of Patent: Oct. 27, 2015

(54) SOLAR CELL ELEMENT AND PROCESS FOR PRODUCTION THEREOF

(75) Inventors: Yoshio Miura, Higashiomi (JP); Shinichi Suzuki, Toyonaka (JP); Daisuke Ota, Otsu (JP)

(73) Assignee: KYOCERA Corporation, Kyoto (JP)

( * ) Notice: Subject to any disclaimer, the term of this patent is extended or adjusted under 35 U.S.C. 154(b) by 480 days.

(21) Appl. No.: 13/640,474

(22) PCT Filed: Apr. 13, 2011

(86) PCT No.: PCT/JP2011/059187
§ 371 (c)(1),
(2), (4) Date: Oct. 10, 2012

(87) PCT Pub. No.: WO2011/129368
PCT Pub. Date: Oct. 20, 2011

(65) Prior Publication Data
US 2013/0025677 A1   Jan. 31, 2013

(30) Foreign Application Priority Data
Apr. 13, 2010  (JP) ................... 2010-092469

(51) Int. Cl.
*H01L 31/0224* (2006.01)
*H01L 31/068* (2012.01)

(52) U.S. Cl.
CPC .. *H01L 31/022425* (2013.01); *H01L 31/02245* (2013.01); *H01L 31/068* (2013.01); *Y02E 10/547* (2013.01)

(58) Field of Classification Search
CPC ... H01L 31/02; H01L 31/0224; H01L 31/068; H01L 31/18

USPC ................................... 136/252, 256
See application file for complete search history.

(56) References Cited

U.S. PATENT DOCUMENTS

| | | | |
|---|---|---|---|
| 2009/0101190 A1* | 4/2009 | Salami et al. | ......... 136/244 |
| 2010/0096014 A1 | 4/2010 | Iida et al. | |
| 2010/0275987 A1 | 11/2010 | Sakamoto et al. | |

FOREIGN PATENT DOCUMENTS

| | | |
|---|---|---|
| JP | S63-213975 A | 9/1988 |
| JP | H11-312813 A | 11/1999 |
| JP | 2007-266649 A | 10/2007 |
| JP | 2008-109016 A | 5/2008 |
| WO | 2008/078374 A1 | 7/2008 |
| WO | 2008/078771 A1 | 7/2008 |

OTHER PUBLICATIONS

International Search Report dated Jun. 21, 2011, issued for International Application No. PCT/JP2011/059187.

* cited by examiner

*Primary Examiner* — Susan D Leong
(74) *Attorney, Agent, or Firm* — Procopio, Cory, Hargreaves & Savitch LLP

(57) ABSTRACT

A solar cell element is disclosed. The solar cell element comprises a semiconductor substrate and electrodes. The semiconductor substrate with a first and second main surface comprises a body and a first layer. The electrodes comprise first electrodes on the first layer and second electrodes on the second main surface. At least one of the first electrodes and the second electrodes comprises silver, copper and nickel as a main component. A method for manufacturing a solar cell element is disclosed. An electrically conductive paste containing silver, copper and nickel is prepared. The electrically conductive paste is applied on the semiconductor substrate. The electrically conductive paste is fired to form the solar cell element.

13 Claims, 7 Drawing Sheets

SOLAR CELL ELEMENT AND PROCESS FOR PRODUCTION THEREOF

FIELD OF ART

The present invention relates to a solar cell element including a semiconductor substrate and electrodes, and to a method for manufacturing the solar cell element.

BACKGROUND ART

When producing a solar cell element including a semiconductor substrate and electrodes, sometimes an electrically conductive paste including silver as the main component is coated onto a semiconductor substrate of silicon or the like in a prescribed pattern, using screen printing, after which firing is done to form the electrode.

Sometimes an electrically conductive paste containing aluminum as the main component is coated by screen printing onto a semiconductor substrate of silicon or the like, and the coated electrically conductive paste is fired to form a collector electrode, after which an electrically conductive paste containing silver as the main component is coated onto the collector electrode, followed by firing to form a lead-out electrode (refer to Patent References 1 to 3 noted below).

PRIOR ART REFERENCES

Patent References

Japanese Laid-open Patent Publication No. H11 (1999)-312814
Japanese Laid-open Patent Publication No. 2008-109016
Japanese Laid-open Patent Publication No. 2007-266649

SUMMARY OF THE INVENTION

Problem to be Solved by the Invention

However, because the quality of the ohmic contact between a semiconductor substrate of silicon or the like and an electrode made of silver provided thereover is poor, and extraction of carriers cannot be done efficiently, this is one cause of a reduction in the photovoltaic conversion efficiency in a solar cell element.

Also, in the case of providing a collector electrode made of aluminum on a semiconductor substrate of silicon or the like and providing a lead-out electrode made of silver thereover, the difference in coefficients of thermal expansion between the semiconductor substrate of silicon or the like and aluminum and the difference in coefficients of thermal expansion between aluminum and silver cause stress to occur, and this may cause warping of the semiconductor substrate.

If warping of the semiconductor substrate occurs in this manner, splitting or cracking tends to occur in the semiconductor substrate in subsequent manufacturing processes, and this may lower the reliability of the manufactured solar cell element.

Given the above, the present invention has as an object to provide a high-reliability solar cell element that can perform carrier extraction efficiently and also in which the semiconductor substrate tends not to warp, and a method for manufacturing the solar cell element.

Means for Solving the Problem

An aspect of the present invention is a solar cell element that includes a semiconductor substrate having a first semiconductor layer of one conductivity type and a second semiconductor layer of the opposite conductivity type, and electrodes for extracting generated electric power. The second semiconductor layer is disposed on at least a first main surface of the semiconductor substrate. The electrodes have first electrodes that are disposed on the second semiconductor layer and second electrodes that are disposed on a second main surface positioned on the side opposite from the first main surface of the semiconductor substrate. In the solar cell element, at least one of the first electrodes and the second electrodes contains silver, copper, and nickel as the main components.

In a method for manufacturing the above-noted solar cell element, at least one of the first electrode and the second electrode is formed by coating an electrically conductive paste containing silver, copper, and nickel as the main components, and then firing the electrically conductive paste.

Effect of the Invention

According to a solar cell element and method for manufacturing a solar cell element that are aspects of the present invention, efficient carrier extraction is possible and also the semiconductor substrate tends not to warp.

EMBODIMENTS FOR PRACTICING THE INVENTION

A solar cell element and method for manufacturing the solar cell element according to an embodiment of the present invention will be described in detail below.

<Basic Constitution of the Solar Cell Element>

Figure 1A:
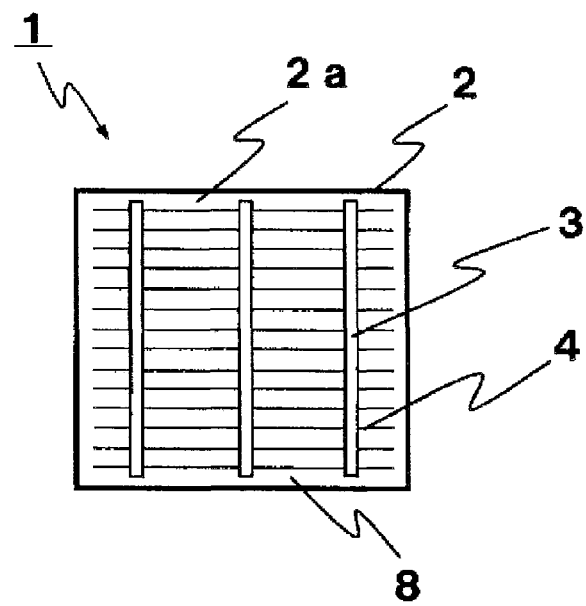
FIG. 1 is a drawing showing in schematic form an example of a solar cell element of a double-sided electrode type according to an embodiment of the present invention, (a) being a plan view showing an example of the outer appearance of the light-receiving surface side of the solar cell element, and (b) being a plan view showing an example of the outer appearance of the rear surface side of the solar cell element.
Figure 1B:
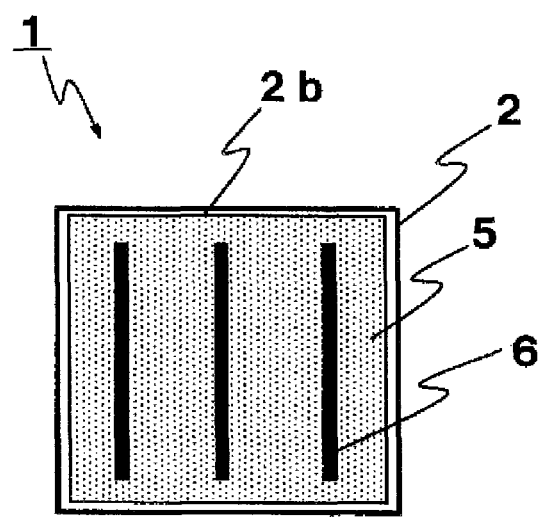

The basic constitution of the solar cell element will be described. For example, as shown in FIG. 1(a) and FIG. 1(b), the solar cell element 1 includes a semiconductor substrate 2 that includes at least a first semiconductor layer of one conductivity type and a second semiconductor layer of the opposite conductivity type, and electrodes (bus bar electrodes 3, finger electrodes 4, collector electrode 5, and output lead-out electrodes 6) for extracting generated electric power. The second semiconductor layer is disposed on at least a first main surface 2a of the semiconductor substrate 2, and the electrodes include first electrodes (bus bar electrodes 3, finger electrodes 4) that are disposed on the second semiconductor layer and second electrodes (collector electrode 5, output lead-out electrodes 6) that are disposed on a second main surface 2b positioned on the side opposite from the first main surface 2a of the semiconductor substrate 2. In the solar cell element 1 at least one of the first electrodes and the second electrodes includes silver, copper, and nickel as the main component.

Herein, the language "contains silver, copper, and nickel as the main component" is taken to mean that the total content of silver, copper, and nickel contains in the electrode is at least 80% by mass, and hereafter "main component" shall mean, in the same manner, a content of 80% or greater by mass.

At least one of the first electrodes and the second electrodes either includes a plurality of first metal regions including a copper-nickel alloy as the main component and a second metal region including silver as the major component that surrounds each of the first metal regions, or includes a first metal region including copper as the main component and a second metal region including silver and nickel as the main component.

The semiconductor substrate 2 may include a first semiconductor layer of one conductivity type and a second semiconductor layer, by preparing a semiconductor substrate of one conductivity type and forming a second semiconductor layer of the opposite conductivity type on at least the first main surface 2a of the semiconductor substrate.

The electrodes provided on the second semiconductor layer of the solar cell element 1 may be provided on only the first main surface 2a side of the semiconductor substrate 2. Also, the electrodes provided on the second semiconductor layer may be formed also on the second main surface 2b side of the semiconductor substrate 2. The solar cell element (back-contact type solar cell element) in that case further includes a plurality of through holes that pass through between the first main surface 2a and the second main surface 2b of the semiconductor substrate 2 and includes conductors disposed within these through holes, the second semiconductor layer being disposed so as to be in contact with the conductors at the inner walls as well of the through holes, and the first electrodes being lead out to the second main surface 2b side of the semiconductor substrate 2 as well via the conductors.

<Double-Sided Electrode Type Solar Cell Element>

Next, a double-sided electrode solar cell element will be described, in which, as shown in FIG. 1(a), FIG. 1(b), and FIG. 2, one type each of electrodes of mutually different polarities is provided on the first main surface 2a, which is the light-receiving side of the semiconductor substrate 2 and, the second main surface 2b, which is the rear surface (non-light-receiving surface) positioned on the side opposite from the first main surface 2a. The materials used in the electricity generating part of the solar cell element 1, although the electrode materials for extracting electrical power therefrom are not restricted, are described below for the case of a silicon-based solar cell element.

The double-sided electrode type solar cell element 1 includes a semiconductor substrate 2 that includes a first main surface 2a to which light is incident and a second main surface 2b positioned on the side opposite from the first main surface 2a, bus bar electrodes 3 and finger electrodes 4 that are provided on the first main surface 2a of the semiconductor substrate 2, and a collector electrode 5 and output lead-out electrodes 6 that are provided on the second main surface 2b.

The semiconductor substrate 2 is made of a silicon wafer of, for example, single-crystal silicon or polycrystalline silicon, and is rectangular when seen in plan view with one side being, for example, approximately 150 to 160 mm. The semiconductor substrate 2 includes a first semiconductor layer of one conductivity type and a second semiconductor layer of a conductivity type opposite from the first semiconductor layer. That is, the semiconductor substrate 2 has a p-type silicon layer and an n-type silicon layer, the junction part between these layers being referred to as the pn junction part.

The electrodes formed on the first main surface 2a of the semiconductor substrate 2 are a plurality of linear bus bar electrodes 3 with a width of approximately 1 to 3 mm and narrow finger electrodes 4, which intersect with the bus bar electrodes 3 substantially perpendicularly when seen in plan view. The finger electrodes 4 are a plurality of linear electrodes provided with a pitch of approximately 2 to 5 mm, the width of the individual linear electrodes being approximately 50 to 200 μm. The thickness of the bus bar electrodes 3 and the finger electrodes 4 is approximately 10 to 20 μm.

It is desirable to form an anti-reflection film 8 beforehand over the entire surface of the first main surface 2a of the semiconductor substrate 2.

The electrodes formed on the second main surface 2b are the collector electrode 5 and the plurality of linear output lead-out electrodes 6. The thickness of the output lead-out electrodes 6 is approximately 10 to 20 μm, and the width of the linear electrodes is approximately 3.5 to 7 mm. The thickness of the collector electrode 5 is approximately 15 to 50 μm.

The finger electrodes 4 and the collector electrode 5 have the role of collecting the generated carriers, and the bus bar electrodes 3 and the output lead-out electrodes 6 have the role of outputting the collected carriers to the outside at the finger electrodes 4 and the collector electrode 5.

Next, the operating effect of the solar cell element 1 will be described. When light strikes from the first main surface 2a side of the solar cell element 1, the light undergoes photovoltaic conversion within the semiconductor substrate 2 to electron carriers and hole carriers. That is, by the action of the above-described pn junction part, electron carriers and hole carriers are collected at the electrodes provided at the first main surface 2a and the second main surface 2b of the solar cell element 1, and a potential difference is generated between the electrodes.

<Process for Producing a Double-Sided Electrode Type Solar Cell Element>

Next an example of a method for manufacturing a double-sided electrode type solar cell element will be described.

Figure 2A:
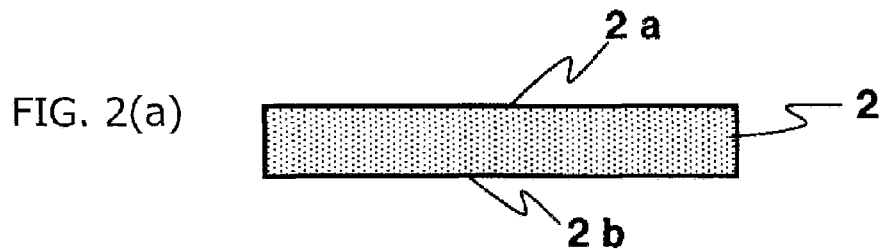
FIG. 2(a) to FIG. 2(e) are cross-sectional views showing manufacturing process steps for a double-sided electrode type solar cell element according to an embodiment of the present invention.

First, as shown in FIG. 2(a), a silicon substrate 2 made of single-crystal silicon or polycrystalline silicon of one conductivity type is prepared. The semiconductor substrate 2 used is preferably a p-type substrate with a resistivity of approximately 0.2 to 2 Ω·cm, using, for example, B (boron) as a dopant. Although the semiconductor substrate 2 used may be an n-type substrate, the description that follows uses a p-type substrate as an example of the semiconductor substrate 2.

If the semiconductor substrate 2 is single-crystal silicon, an ingot is produced by a pulling method such as the Czochralski method. If the semiconductor substrate 2 is polycrystalline silicon, the ingot is manufactured by the casting method or the like. Polycrystalline silicon has an advantage over single-crystal silicon in that it can be mass-produced. The following description uses the example of polycrystalline silicon used as the semiconductor substrate 2.

Using, for example, a wire saw, the polycrystalline silicon ingot is sliced to a thickness of 350 μm or less, and preferably 200 μm or less (for example 150 to 200 μm) to form the semiconductor substrate 2. To clean the contaminated layer attached to surface of the semiconductor substrate 2 when slicing is done, it is desirable to perform a very small amount of etching, using an NaOH solution, a KOH solution, or a mixed solution of hydrofluoric acid and fluoronitric acid or the like.

Next, it is preferable to use dry etching or wet etching or the like, or RIE (reactive ion etching) or the like to form an uneven (rough-surface) structure functioning to reduce light reflectivity at the first main surface 2a side of the semiconductor substrate 2.

Figure 2B:
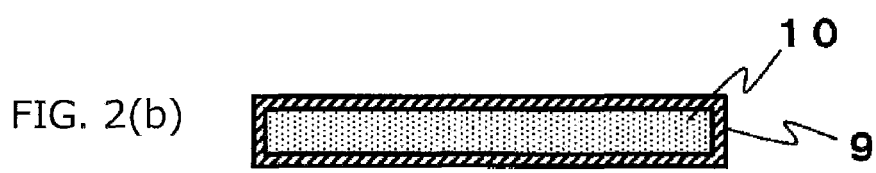

Next, as shown in FIG. 2(b) an n-type layer 9 is formed over the entire surface of the semiconductor substrate 2. P (phosphorus) is preferable to use as the doping element, and the sheet resistance of the n-type layer 9 is made 30 to 300 Ω/square. By doing this, a pn junction part is formed between the n-type layer 9 and a p-type bulk region 10.

The n-type layer 9 is formed to a thickness of approximately 0.2 to 0.7 μm by heating the semiconductor substrate 2 to approximately 700 to 900° C., after which gas-phase thermal diffusion is done for approximately 20 to 40 minutes while maintaining the temperature in an atmosphere of gasified $POCl_3$ (phosphorus oxychloride) to be used as a diffusion source 22. When this is done, phosphorus glass is formed over the entire surface of the semiconductor substrate 2. The semiconductor substrate 2 is immersed in hydrofluoric acid to remove the phosphorus glass, followed by washing and drying.

Figure 2C:
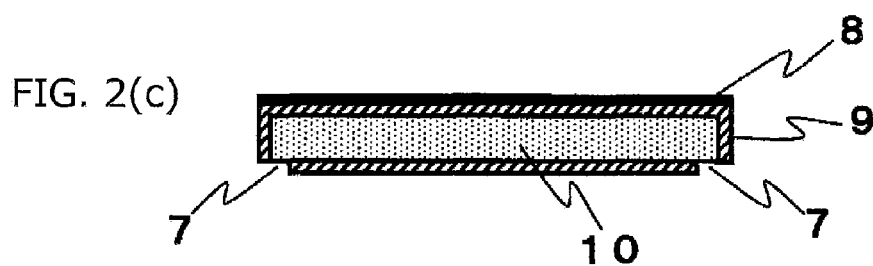

Next, as shown in FIG. 2(c), a part of the n-type layer 9 formed at the end face outer peripheral part of the second main surface 2b of the semiconductor substrate 2 is removed, the removed part 7 performs pn separation (cutting apart the continuous part of the pn junction part by removing the pn junction part or by forming a groove in the pn junction part). This removal of part of the n-type layer 9 is done by sandblasting that blows particles of alumina or silicon oxide at a high pressure onto the end face peripheral part of the second main surface 2b of the silicon wafer, or by forming a separation groove that reaches the pn junction part by using a YAG (yttrium-aluminum-garnet) laser or the like.

Next, as shown in FIG. 2(c), the anti-reflection film 8 is formed on the first main surface 2a. A SiNx (silicon nitride) film, a $TiO_2$ film, an $SiO_2$ film, an MgO film, an ITO film, an $SnO_2$ film, or a ZnO film or the like may be used as the material for the anti-reflection film 8. The thickness of the anti-reflection film 8 is selected as appropriate in accordance with the material, so as to achieve the no-reflection condition with respect to appropriate incident light. For example, in the case of the semiconductor substrate 2, the index of refraction may be approximately 1.8 to 2.3 and the thickness may be approximately 500 to 1200 Å. The anti-reflection film 8 may be manufactured by RECVD (plasma-enhanced chemical vapor deposition), by evaporation deposition, or by sputtering or the like.

Figure 2D:
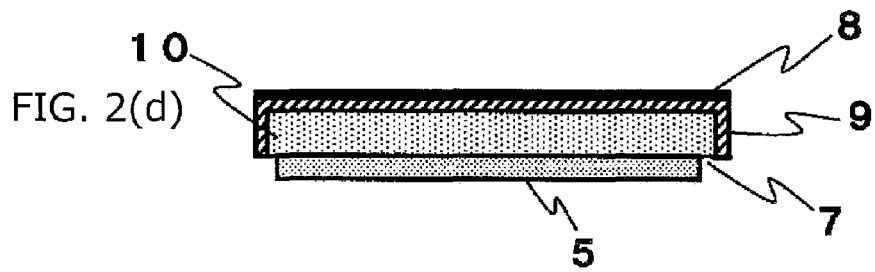

Next, as shown in FIG. 2(d) the collector electrode 5 is formed on the second main surface 2b side of the semiconductor substrate 2. The collector electrode 5 is formed coating a paste containing aluminum as the main component onto substantially the entire surface of the second main surface 2b, with the exception of a width of approximately 1 to 5 mm at the outer periphery of the second main surface 2b. Screen printing can be used as the method of coating. The paste used to form the collector electrode 5 is one made of aluminum powder and an organic vehicle that, after coating, is heat treated (fired) at a temperature of approximately 700 to 850° C. to burn the aluminum onto the semiconductor substrate 2. By printing and firing this aluminum paste, it is possible to cause high-concentration diffusion of the aluminum, which is a p-type impurity, into the coated part of the semiconductor substrate 2, and it is possible to change the n-type layer that is formed on the rear surface side as well into a layer of $p^+$ type.

Figure 2E:
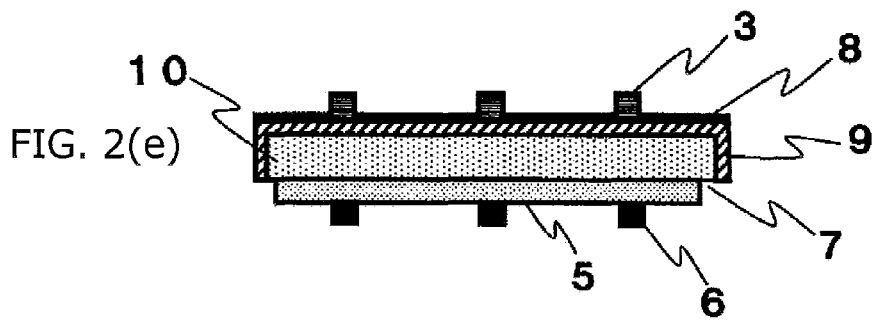

Next, as shown in FIG. 2(e), electrodes (bus bar electrodes 3 and finger electrodes 4) on the first main surface 2a side and the output lead-out electrodes 6 on the second main surface 2b are formed.

The output lead-out electrodes 6 on the second main surface 2b can be formed by coating with an electrically conductive paste containing silver, copper, and nickel as the main component. The inclusion of copper and nickel in the form of an alloy in an electrically conductive paste is desirable from the standpoint of improving the quality of the ohmic contact with the semiconductor substrate 2 of silicon and alleviating stress caused by the difference in the coefficient of thermal expansion between the semiconductor substrate 2 of silicon and the output lead-out electrodes 6.

The electrically conductive paste for forming the output lead-out electrodes 6 is, for example, a mixture of silver particles; copper-nickel alloy particles; an organic vehicle; and glass frits (for example, aluminum borosilicate glass, bismuth oxide or the like). In this mixture, silver particles have an average particle diameter of 0.1 to 5 μm, and the copper-nickel alloy particles have an average particle diameter of 0.5 to 6 μm, made of an alloy of copper and nickel (hereinafter copper-nickel alloy) the surfaces of which are covered with silver to a thickness of 0.1 to 1.5 μm. These mixtures are mixed by kneading to have, with respect to 100 parts by mass of silver, copper, and nickel, 5 to 30 parts by mass and 0.1 to 15 parts by mass, respectively, of the organic vehicle and the glass frits, and additionally a solvent (such as terpineol, diethylene glycol monobutyl ether, or dibutyl phthalate or the like) is used to adjust the viscosity to approximately 50 to 200 Pa·s.

The above-noted kneading may be done beforehand, making two kneaded pastes, one of mixture of silver particles, the organic vehicle, and glass frits, and the other of mixture of the copper-nickel alloy particles covered by silver, the organic vehicle, and glass frits. The above is preferable so that after that, these two pastes may be mixed in prescribed proportions and a solvent or the like may be used to adjust to a prescribed viscosity and to achieve a more homogeneous mixing of the silver particles and the copper-nickel alloy particles.

In this case, the above-noted electrically conductive paste may use a mixture of, for example, silver particles having an average particle diameter of 0.1 to 5 μm; copper-nickel alloy particles having an average particle diameter of 0.5 to 6 μm; an organic vehicle; and glass frits (for example, aluminum borosilicate glass or bismuth oxide). In the case of this electrically conductive paste as well, conditions such as the amount of content and the viscosity of materials for other parts are made the same as those described above. In this case as well, as noted above, a paste containing silver particles and a paste containing copper-nickel alloy particles may be prepared, and these may be mixed by kneading to adjust the viscosity.

The above-noted electrically conductive paste may also use a mixture, for example, of silver particles having an average particle diameter of 0.1 to 5 μm; copper particles, the surfaces of which are covered with nickel and having an average particle diameter of 0.5 to 6 μm; an organic vehicle; and glass frits (for example, aluminum borosilicate glass or bismuth oxide). In this case as well, conditions such as the amount of content and viscosity of materials for other parts are made the same as those described above. In this case as well, similar to that noted above, a paste containing silver particles and a paste containing copper particles, the surfaces of which are covered by nickel, may be prepared, and these may be mixed by kneading to adjust the viscosity.

Alternatively, the above-noted electrically conductive paste may use a mixture, for example, of nickel particles having an average particle diameter of 0.1 to 5 μm; copper particles, the surfaces of which are covered with silver and having an average particle diameter of 0.5 to 61 μm; an organic vehicle; and glass frits (for example, aluminum borosilicate glass, or bismuth oxide). In this case as well, conditions such as the amount of content and viscosity of materials for other parts are made the same as those described above. In this case as well, similar to that noted above, a paste containing nickel particles and a paste containing copper particles, the surfaces of which are covered by silver, may be prepared, and these may be mixed by kneading to adjust the viscosity.

The method of coating the electrically conductive paste may be screen printing or the like, and it is preferable after coating to perform drying by causing transpiration of the solvent at a prescribed temperature.

The electrically conductive paste that contains silver particles adjusted as noted above and copper-nickel alloy particles, the surface of which is covered by silver, is coated onto the collector electrode 5 and, after drying, this is fired in a fire furnace at a maximum temperature of 500 to 650° C. for approximately several tens of seconds to several tens of minutes to form the output lead-out electrodes 6. In the firing of the electrically conductive paste containing silver and the copper-nickel alloy, to prevent oxidation of the contained copper-nickel alloy particles, it is desirable to introduce into the oven an inert gas, such as nitrogen gas, so that the oxygen concentration at a position in the vicinity of the peak temperature in the oven is less than 500 ppm.

The process step of forming the rear surface 2b side electrodes may be, as described above, formation of the collector electrode 5 by coating and firing of an aluminum paste, followed by coating and firing of the above-described electrically conductive paste containing silver and the copper-nickel alloy to form the output lead-out electrodes 6 separately. Alternatively, the process may be coating and drying of the aluminum paste, followed by coating of the electrically conductive paste containing silver and the copper-nickel alloy and then simultaneous firing of both.

In the results of repeated experiments by the inventors, it was desirable that the copper:nickel mass ratio of the copper-nickel alloy be in the range 95:5 to 60:40. If the copper proportion exceeds 95 the copper tends to oxidize, and the resistance value of the electrode after firing increases. On the other hand, if the proportion of the copper is less than 60, the proportion of nickel becomes excessive, and the resistance value of the electrode after firing increases. Because the photovoltaic conversion efficiency of the solar cell element decreases even if the proportion of copper is either high or low, the mass ratio is made the above-noted appropriate ratio.

Also, as described above, when the paste that has aluminum as the main component is coated and fired onto the semiconductor substrate 2 to form the collector electrode 5, and the electrically conductive paste containing the copper-nickel alloy and silver is coated and fired thereover to form the output lead-out electrodes 6, because the hardness is smaller than when using an electrically conductive paste of silver only, it is possible to alleviate stress caused by the difference in coefficients of thermal expansion, thereby enabling reduction in the warping of the semiconductor substrate 2.

Next, electrodes (bus bar electrodes 3 and finger electrodes 4) on the first main surface 2a of the semiconductor substrate 2 are formed. In the formation of the bus bar electrodes 3 and the finger electrodes 4 as well, in order to enable a further reduction in the warping of the solar cell element, formation is desirably done by coating an electrically conductive paste containing silver and a copper-nickel alloy.

The electrically conductive paste for the formation of the bus bar electrodes 3 and the finger electrodes 4 as well contains silver and a copper-nickel alloy and is prepared under the above-described conditions. Also, the electrically conductive paste in this case as well can be coated by screen printing or the like, and it is preferably followed by transpiration to dry the solvent at a prescribed temperature.

After coating and drying the electrically conductive paste for the formation of the bus bar electrodes 3 and the finger electrodes 4, firing is done in a fire furnace at a maximum temperature of 500 to 650° C., for approximately several tens of seconds to several tens of minutes to form the bus bar electrodes 3 and the finger electrodes 4. In the firing of the electrically conductive paste containing the silver and copper-nickel alloy, to prevent oxidation of the contained copper-nickel alloy particles, it is desirable to introduce into the oven an inert gas, such as nitrogen gas, so that the oxygen concentration at a position in the vicinity of the peak temperature in the oven is less than 500 ppm.

In the firing of the electrically conductive paste for formation of the bus bar electrodes 3 and the finger electrodes 4, rather than being done separately, it is desirably done simultaneously with the firing of the electrically conductive paste for formation of the above-described output lead-out electrodes 6, because it results in only one firing, and enables suppression of oxidation of the copper-nickel alloy.

<Back-Contact Type Solar Cell Element>

Next, a back-contact type solar cell element, in which two kinds of electrodes of mutually different polarities are provided on the second main surface side, which is taken as the rear surface, will be described.

As shown in FIG. 3 and FIG. 4, a back-contact type solar cell element 21 has is constituted by a semiconductor substrate 25 that includes a main surface 21a that serves as the light-receiving surface receiving sunlight, a second main surface 21b that is the rear surface thereof, and that has a plurality of through holes 28 that pass through the first main surface 21a and the second main surface 21b.

The through holes 28 are filled with an electrically conductive filling material G, which is a conductor, forming through hole electrodes 22b.

Figure 3A:
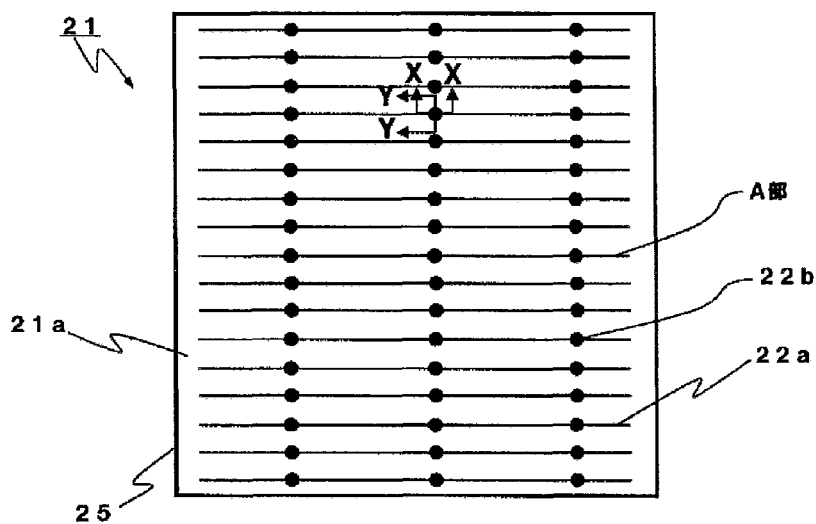
FIG. 3 is a drawing showing in schematic form a back-contact type solar cell element according to an embodiment of the present invention, (a) being a drawing showing an example of the outer appearance of the light-receiving surface side of the solar cell element, and (b) being a drawing showing an example of the outer appearance of the rear surface side of the solar cell element.

Light-receiving surface electrodes 22a, as shown in FIG. 3(a), are provided on the first main surface 21a of the solar cell element 21 as a plurality of narrow straight-line electrodes with substantially uniform spacing, and about one to five through hole electrodes 22b are connected to each one light-receiving surface electrode 22a at substantially the same positions thereon. In this manner, at least one through hole electrode 22b is provided on one light-receiving surface electrode 22a, enabling the density of the photoelectric current in each through hole electrode 22b to be reduced, and enabling the resistive component of the solar cell element 21 to be reduced.

Figure 3B:
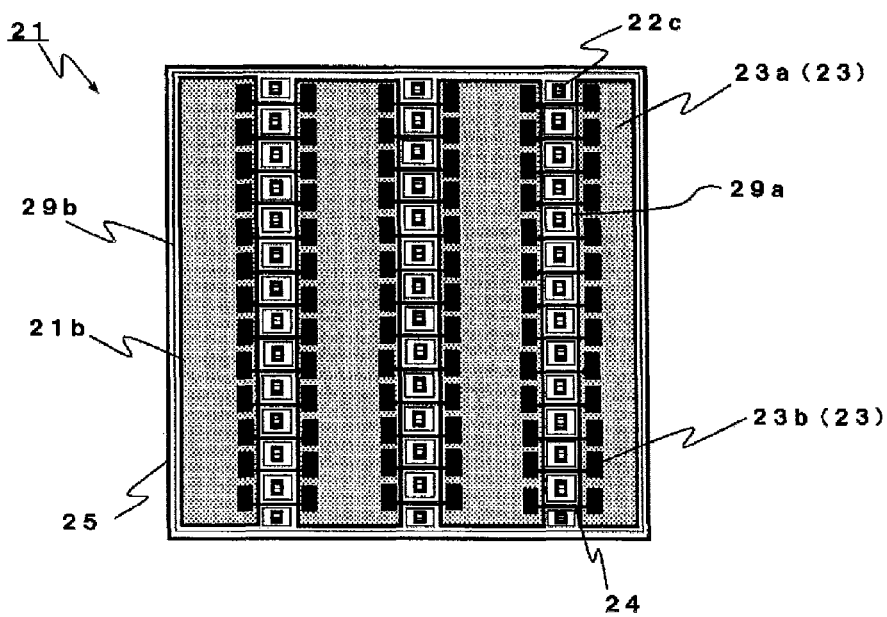

The first electrodes 22c are formed on the second main surface 21b and correspond to the electrodes on the first main surface 21a. As shown in FIG. 3(b), a plurality of the first electrodes 22c, each having rectangular shape, are directly below and electrically connected to the through hole electrodes 22b, and arranged in a straight line with a substantially uniform spacing. One of the first electrodes 22c has one or a plurality of through hole electrodes 22b connected thereto.

Additionally, second electrodes 23 having a polarity that is different from that of the first electrodes 22c is provided on the second main surface 21b. The second electrode 23 is constituted by collector electrode 23a and output lead-out electrodes 23b.

That is, the collector electrode 23a is disposed at the part other than the parts of the first electrodes 22c that are disposed in the above-noted straight lines and the parts theresurrounding, and the output lead-out electrodes 23b are pr vided on the collector electrode 23a.

The output lead-out electrodes 23b are provided at positions that are opposite on each of the collector electrodes 23a so that the output lead-out electrodes 23b sandwich the first electrodes 22c. The third electrodes 24 electrically connect two regions of the opposing output lead-out electrodes 23b.

Figure 4A:
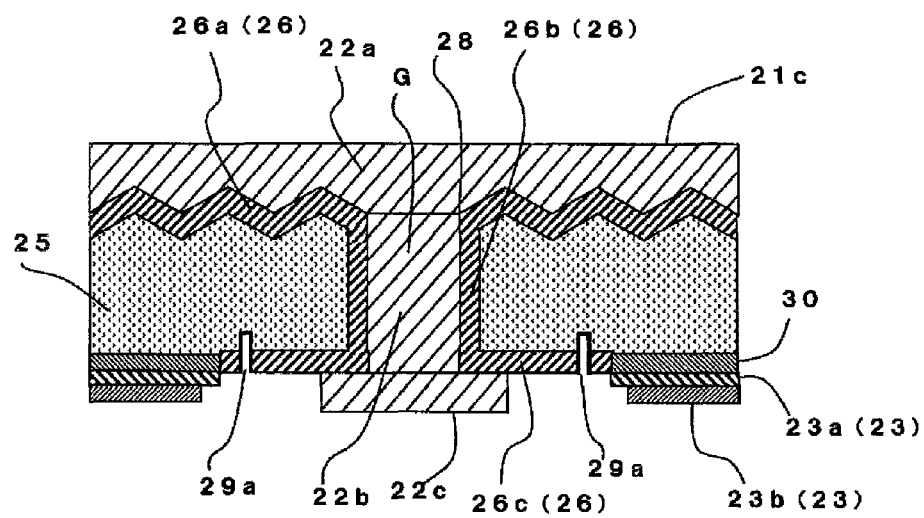
FIG. 4(a) is a cross-sectional view along the cutting line in the X-X direction in FIG. 3(a)
Figure 4B:
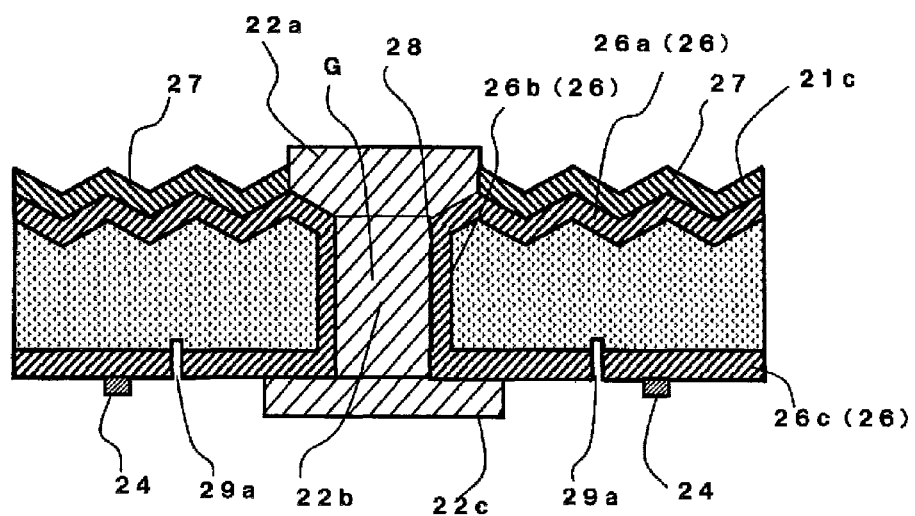
FIG. 4(b) is a cross-sectional view along the cutting line Y-Y in FIG. 3 (a).

The semiconductor substrate 25 is mainly one conductivity type and, as shown in FIG. 4(a) and FIG. 4(b), has an opposite-conductivity type semiconductor layer 26 (first opposite-conductivity type layer 26a and third opposite-conductivity type layer 26c) with a conductivity type different from that of the semiconductor substrate 25 on the first main surface 21a and the second main surface 21b of the semiconductor substrate 25. Also, a second opposite-conductivity type layer 26b is provided on the inner walls of the through holes 28 of the semiconductor substrate 25.

If a p-type silicon substrate is used as the semiconductor substrate 25 exhibiting main one conductivity type, such an opposite-conductivity type layer 26 would be an n-type that is formed by diffusing an n-type impurity such as phosphorus into the semiconductor substrate 25 surface and inner walls of the electrode through holes 28.

In FIG. 4(a) and FIG. 4(b), if aluminum is used as the main electrode material of the collector electrode 23a, when it is coated and fired to form the collector electrode 23a, it is possible to simultaneously form a high-concentration doped layer 30. That is, the collector electrode 23a is formed over the high-concentration doped layer 30. By doing this, carriers generated within the semiconductor substrate 25 are efficiently collected. In this case, the term high-concentration means an impurity concentration that is higher than the concentration of the one conductivity impurity in the semiconductor substrate 25.

In this manner, in the solar cell element 21 of the present embodiment, light-receiving surface electrodes 22a and through hole electrodes 22b are provided on the first main surface 21a and inside the through holes 28. Also, on the second main surface 21b thereof, first electrodes 22c are provided on the opposite-conductivity type semiconductor layer 26, and collector electrode 23a and output lead-out electrodes 23b are formed as second electrodes 23 on the part in which the opposite-conductivity type semiconductor layer 26 is not formed.

Also, in order to electrically separate (pn separate) the junction part between the one conductivity type (for example, p-type) of the semiconductor substrate 25 and the opposite-conductivity type layer (for example, n-type), separation trenches 29a are provided in the peripheral area so as to surround the first electrodes 22c, and a separation trench 29b is further provided on the outer peripheral edge of the rear surface 21b of the semiconductor substrate 25, as shown in FIG. 3(h).

The light-receiving surface electrodes 22a, the through hole electrodes 22b, the first electrodes 22c and the output lead-out electrodes 23b of the present embodiment are formed by coating an electrically conductive paste containing silver and a copper-nickel alloy using screen printing or the like, followed by firing. By doing this, it is possible to provide a solar cell element 21 having superior electricity generating efficiency, little warping, and high reliability.

<Method for Manufacturing a Back-Contact Type Solar Cell Element>

Next, a method for manufacturing the back-contact type solar cell element 21 will be described.

First, the process of preparing the semiconductor substrate will be described. For example, a p-type silicon substrate doped with boron is prepared as the semiconductor substrate 25 that exhibits one conductivity type. A single-crystal silicon substrate or a polycrystalline silicon substrate that is sliced from the silicon ingot may be used as this silicon substrate, the size of which is, for example, a rectangular with one side being approximately 140 to 180 mm, and the thickness of which is approximately 150 µm to 300 µm.

Next, the process of forming the through holes 28 will be described. Through holes 28 are formed between the first main surface 21a and rear surface 21b of the semiconductor substrate 25. The through holes 28 are formed, for example, so as to pass from the second main surface 21b side to the first main surface 21a side of the semiconductor substrate 25, using a mechanical drill, a water jet, or a laser apparatus or the like. In order to suppress the occurrence of microcracks during and after the formation of the through holes 28, it is preferable that a laser apparatus or the like be used. The laser used may be, for example, an excimer laser, a YAG (yttrium-aluminum-garnet) laser, or a $YVO_4$ (yttrium vanadate) laser. The preferable diameter of the through holes 28 is approximately 20 to 50 µm.

Next, the surface etching will be described. The semiconductor substrate 25 in which the through holes 28 are provided is etched by approximately 5 to 20 mm, using an aqueous solution of sodium hydroxide having a sodium hydroxide content of approximately 10 to 30% wt at a temperature of 60 to 90° C. By doing this, the side surfaces on the inside of the through holes 28 are also etched and made rough surfaces. This roughening enables an increase in the contact surface area with the electrically conductive filling material G, and enables an improvement in the adhesion strength between the two substances. This etching also enables removal of a damaged layer occurring by slicing from the above-described silicon ingot. Additionally, it enables roughening of the first main surface 21a as well, thereby suppressing reflection of light incident to the solar cell element 21, and enabling an improvement in the photovoltaic conversion efficiency thereof.

Next, the formation of the opposite-conductivity type layer will be described. The opposite-conductivity type layer 26 is formed on the surface of semiconductor substrate 25. To form the opposite-conductivity type layer 26, a phosphor is used as an n-type doping element, to obtain an $n^+$-type sheet resistance of approximately 60 to 300 Ω/square. By doing this, a pn junction part is formed between the opposite-conductivity type layer 26 and the p-type bulk region.

Additionally, when gas-phase diffusion, for example, is used in the opposite-conductivity type layer 26, it is possible to simultaneously form the opposite-conductivity type layer 26 on both surfaces of the semiconductor substrate 25 and on the inner walls of the through holes 28. The formation of the opposite-conductivity type layer 26b on the inner walls of the through holes 28 enables suppression of leakage current in that part.

Next, the formation of the anti-reflection film will be described. It is preferable to form an anti-reflection film 27 on the first opposite-conductivity type layer 26a. A silicon nitride film, a titanium nitride film or the like may be used as the material for the anti-reflection film 27. The method used for forming the anti-reflection film 27 may be PECVD, evaporation deposition, sputtering, or the like.

Next, the formation of the light-receiving surface electrodes and the through hole electrodes will be described. The light-receiving surface electrodes 22a and the through hole electrodes 22b are formed on the semiconductor substrate 25. With regard to the light-receiving surface electrodes 22a and the through hole electrodes 22b as well, it is desirable that the formation be done by coating an electrically conductive paste containing silver and a copper-nickel alloy.

The electrically conductive paste for forming the light-receiving surface electrodes 22a and the through hole electrodes 22b is adjusted to a viscosity of approximately 50 to 200 Pa·s, under the same conditions described with regard to the double-sided electrode type solar cell element, by mixing silver particles, copper-nickel alloy particles, the surfaces of which are covered with silver, an organic vehicle, glass frits, or the like.

Screen printing or the like can be used as the method of coating the electrically conductive paste, followed by drying of the solvent by causing transpiration at a prescribed temperature.

If an electrically conductive paste containing silver particles made under the same conditions as above and copper-nickel alloy particles covered with sifter is used in forming the light-receiving surface electrodes 22a and the through hole electrodes 22b, it is desirable to coat separately with different viscosities. First, to form the through hole electrodes 22b, after adjusting the viscosity of the electrically conductive paste containing silver particles and copper-nickel alloy particles to a low viscosity of approximately 50 to 100 Pa·c to facilitate the entering of the electrically conductive paste into the through holes 28, the electrically conductive paste is coated by screen printing, followed by drying. Then, after coating the electrically conductive paste containing silver particles and copper-nickel alloy particles for forming the light-receiving surface electrodes 22a and adjusting the viscosity to approximately 150 to 200 Pa·s so that it is difficult for the shape to collapse, coating is done by screen printing, followed by drying. By doing this, in addition to achieving a low resistance in the electrical connection between the light-receiving surface electrodes 22a and the through hole electrodes 22b of the first electrodes 22c, it is possible to suppress the collapse of the paste after screen printing of the light-receiving surface electrodes 22a and the reduction of the light-receiving surface area.

After coating and drying the electrically conductive paste for forming the light-receiving surface electrodes 22a and the through hole electrodes 22b, firing is done in a firing furnace at a maximum internal furnace temperature of 500 to 650° C. for approximately several tens of minutes. In the firing of the electrically conductive paste containing the silver particles and copper-nickel alloy particles, in order to prevent oxidation of the contained copper-nickel alloy particles, it is desirable that an inert gas such as nitrogen gas be introduced into the furnace so that the oxidation concentration at a position in the vicinity of the peak temperature within the furnace is less than 500 ppm.

Next, the formation of the collector electrode will be described. The collector electrode 23a is formed on the rear surface 21b of the semiconductor substrate 25. Using the method of screen printing, an electrically conductive paste having aluminum as the main component is coated with the prescribed electrode shape onto the rear surface 21b of the semiconductor substrate 25, as described above, after which firing as described above is done to form the collector electrode 23a. By doing this, it is also possible to form a high-concentration doped layer 30 in which the one conductivity type semiconductor impurity is diffused with high concentration.

Next, the process of forming the first electrodes 22c, the output lead-out electrodes 23b, and the third electrodes 24 will be described. The first electrodes 22c, the output lead-out electrodes 23b, and the third electrodes 24 are formed on the rear surface 21b of the semiconductor substrate 25. In the back-contact type solar cell element 21, the first electrodes 22c, the output lead-out electrodes 23b, and the third electrodes 24 are formed by using an electrically conductive paste containing silver particles and copper-nickel alloy particles, the surfaces of which are covered with silver, as described above.

That is, using the method of screen printing, an electrically conductive paste containing silver and copper-nickel alloy is coated onto to the rear surface 21b of the semiconductor substrate, for example, followed by firing to form the first electrodes 22c, the output lead-out electrodes 23b, and the third electrodes 24 shown in FIG. 3(b).

After coating and drying the electrically conductive paste for forming the first electrodes 22c, the output lead-out electrodes 23b, and the third electrodes 24, firing is done in a firing furnace at a maximum internal furnace temperature of 500 to 650° C. for approximately several tens of minutes. In the firing of the electrically conductive paste containing silver particles and the copper-nickel alloy particles, to prevent oxidation of the contained copper-nickel alloy particles, it is desirable to introduce into the furnace an inert gas such as nitrogen so that the oxygen concentration at a position in the vicinity of the peak temperature in the furnace is less than 500 ppm.

Next, the pn separation process will be described. For example, when the above-described gas phase diffusion method is used to form the opposite-conductivity type layer, the opposite-conductivity type layer 26 is simultaneously formed on both surfaces of the semiconductor substrate 25 and on the inner walls of the through holes 28. For this reason, separation (pn separation) is done between the opposite-conductivity type layer 26 of the rear surface 21b and the first main surface 21a of the semiconductor substrate 25. The pn separation can be done by the following two methods. In the blasting method, a powder of silicon oxide, alumina, or the like is blown at a high pressure onto only the peripheral part of the rear surface 21b so that the opposite-conductivity type layer of the surrounding part of the rear surface 21b is shaved off. Alternatively, in the laser machining method, a separation trench 29b is formed in the peripheral edge part of the rear surface 21b.

Next, pn separation of the first electrodes 22c peripheral part is done. Laser light from, for example, a YAG laser (1064 nm wavelength) is caused to strike the peripheral part of the first electrodes 22c, that is, the part of the semiconductor substrate 25 formed between the first electrodes 22c and the collector electrode 23a, that is, the first electrodes 22c and the third electrodes 24, so as to form the rectangular separation trenches 29a.

By doing the above, it is possible to manufacture a back-contact type solar cell element that is capable of exhibiting the same effect as a double-sided electrode type solar cell element. Also, the back-contact type solar cell element is not restricted to the above-described solar cell element, and application is also possible to a back-contact type solar cell element having an LBC (interdigitated back contact) without the formation of through holes.

<Electrode Micro-Structure>

Figure 5:
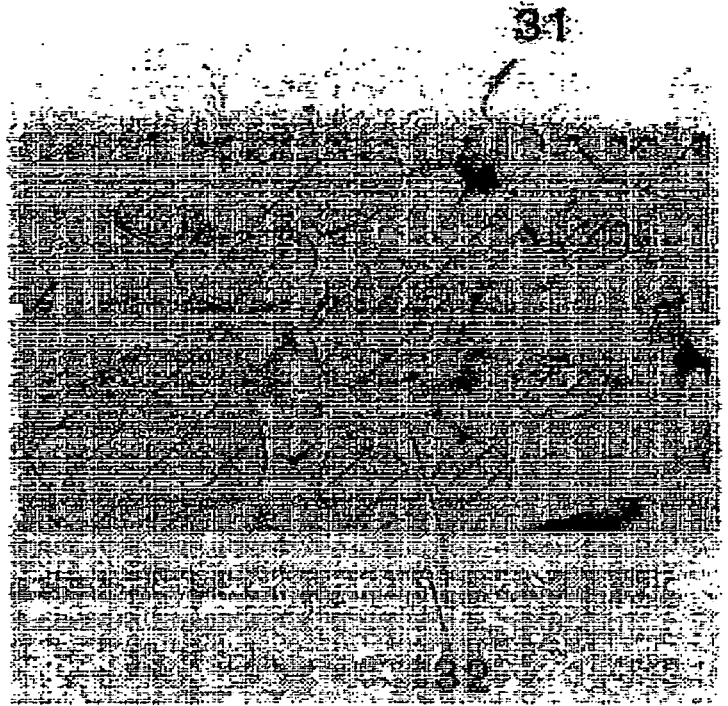
FIG. 5 is a copy of an SEM photograph of a bus bar electrode, this drawing showing a plurality of metal regions that contain a copper-nickel alloy as the main component and a metal region containing silver as the main component surrounding each of these metal regions.
Figure 6:
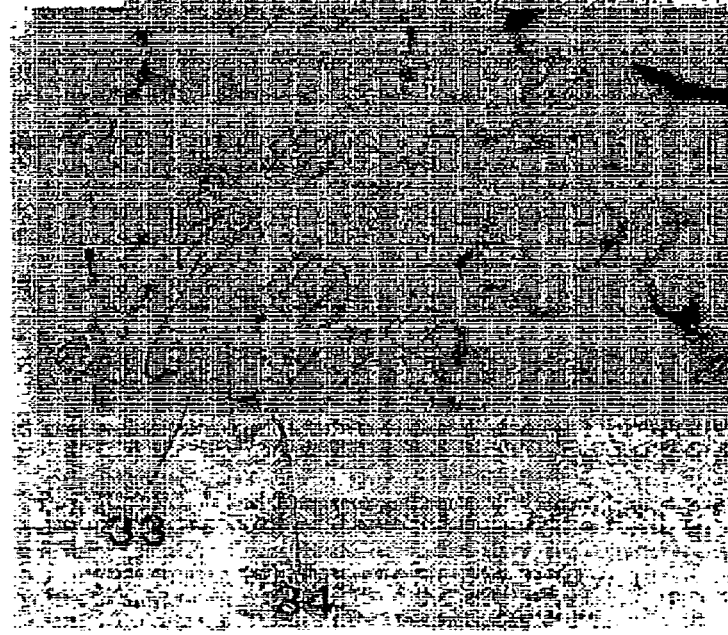
FIG. 6 is copy of an SEM photograph of a bus bar electrode, this drawing showing a first metal region that contains copper as the main component and a second metal region that contains silver and nickel as main components.

Next, the bus bar electrode 3 provided on the first main surface 2a side in the double-sided electrode type solar cell element 1 was photographed at a magnification of 5000 using a SEM (scanning electron microscope), a copies of those photographs being shown in FIG. 5 and FIG. 6.

FIG. 5 is a magnified view of an electrode obtained by firing an electrically conductive paste containing, as described above, silver particles with an average particle diameter of 0.1 to 5 μm and copper-nickel alloy particles with an average particle size of 0.5 to 6 μm, with a silver covering having a thickness of 0.1 to 1.5 μm on the surfaces thereof. As shown in FIG. 5, it can be seen that there are a plurality of first metal regions 31 (regions shown by inclined hatching lines) containing copper-nickel alloy as the main component and a second metal region 32 that surrounds each of the first metal regions 31 and that has silver as the main component. An electrode having a metal micro-structure such as this, by the presence of the difficult-to-oxidize copper-nickel alloy and silver, enables an improvement in the anti-oxidation properties of the electrode.

FIG. 6 is a magnified view of an electrode obtained by firing an electrically conductive paste containing, as described above, silver particles with an average particle diameter of 0.1 to 5 μm and copper particles with an average particle size of 0.5 to 6 μm, with a nickel covering having a thickness of 0.1 to 1.5 μm on the surfaces thereof. As can be understood from FIG. 6, there are first metal regions 33 (regions shown by inclined hatching lines) containing copper as the main component and a second metal region 34 that has silver and nickel as the main component. In an electrode having a metal micro-structure such as this, by increasing the proportion of silver and copper in the electrodes and decreasing the mass ratio of nickel, it is possible to reduce the warping of the solar cell element.

VARIATION EXAMPLE

As described above, the present embodiment is not restricted to a solar cell element that uses a semiconductor substrate made of crystals only. For example, i-type and p-type amorphous silicon layers may be formed in this sequence on one main surface of an n-type silicon substrate and i-type and n-type amorphous silicon layers may be formed in this sequence on the other main surface, the overall constituting a semiconductor substrate on which electrodes are provided. The present embodiment can be applied to this type of solar cell element as well, and can be expected to achieve the same type of operation and effect.

EXAMPLES

Examples of double-sided electrode type solar cell elements will be described below.

First, a p-type semiconductor substrate 2 made from polycrystalline silicon manufactured by casting was prepared. The semiconductor substrate 2 contained approximately $1 \times 10^{16}$ to $10^{18}$ atoms/cm$^3$ of boron, which is a p-type doping element, and was a square having sides of approximately 150 mm, with a thickness of approximately 0.2 mm.

To clean the surface of the semiconductor substrate 2, the surface thereof was etched by a very small amount in an aqueous solution of sodium hydroxide of approximately 20%, after which it was washed.

Next, an RIE (reactive ion etching) apparatus was used to form fine unevenness structure with the function of reducing a light reflectivity in (i.e., roughen the surface of) the first main surface 2a side of the semiconductor substrate 2, which will be the light incidence surface.

Then, an n-type layer 9 was formed over the entire surface of the semiconductor substrate 2. Phosphorus was used as the n-type doping element, to obtain an n-type sheet resistance that is made approximately 50 to 100 Ω/square. A pn junction part was formed between the n-type layer 9 and the p-type bulk region that occupies most of the region of the semiconductor substrate 2.

The n-type layer 9 was formed in the following manner. The semiconductor substrate 2 was heated to a temperature of approximately 700 to 900° C. and, while maintaining the temperature, was subjected to gas-phase thermal diffusion processing for approximately 20 to 40 minutes in an atmosphere of POCl$_3$ (phosphorus oxychloride), which was gasified as the diffusion source, so as to form the n-type layer 9 to a depth of approximately 0.3 to 0.6 μm. In this case, because phosphorus glass is formed over the entire surface of the semiconductor substrate 2, in order to remove the phosphorus glass, the semiconductor substrate 2 was immersed in hydrofluoric acid for approximately 10 seconds, after which it was washed and dried.

Next, the anti-reflection film 8 was formed. That is, as the anti-reflection film 8, an SiN$_x$ (silicon nitride) film was deposited onto the surface of the first main surface 2a side by PECVD (plasma-enhanced chemical vapor deposition) apparatus, using monosilane gas and ammonia gas at a temperature of approximately 450° C. For the SiN$_x$ film to have an anti-reflection effect, it was given an index of refraction of approximately 2.0 and a film thickness of approximately 80 nm.

After that, to perform pn separation, a laser beam was shined onto the peripheral edge part of the second main surface 2b side of the semiconductor substrate 2 to form a separation trench to deeper than a depth that reaches the pn junction part. A YAG laser apparatus was used in this separation.

After that, the collector electrode 5 was formed on the second main surface 2b side of the semiconductor substrate 2. The collector electrode 5 was formed by coating a paste having aluminum as the main component over substantially the entire surface of the second main surface 2b, using screen printing, with the exception of the peripheral part of approximately 1 mm.

The paste used to form the collector electrode 5 was made of aluminum powder and an organic vehicle that, after coating, was fired at a maximum temperature of approximately 800 to 850° C. to burn it onto the semiconductor substrate 2. The thickness of the collector electrode 5 after firing was approximately 30 to 50 µm.

Next, the output lead-out electrodes 6 were formed on the collector electrode 5. The electrically conductive paste used to form the output lead-out electrodes 6 was as follows.

Using particles of a mass proportion of the copper-nickel alloy such that copper:nickel=9:11, an electrically conductive paste in which the copper-nickel alloy mass proportion with respect to silver was varied was manufactured as shown in table 1. Table 1 shows the metal-converted mass proportions of copper and nickel, with silver taken as 100.

TABLE 1

| Paste Name | Silver | Copper | Nickel |
|---|---|---|---|
| P1 | 100 | 0 | 0 |
| P2 | 100 | 10 | 1 |
| P3 | 100 | 23 | 2 |
| P4 | 100 | 39 | 4 |
| P5 | 100 | 60 | 7 |
| P6 | 100 | 90 | 10 |
| P7 | 100 | 135 | 15 |
| P8 | 100 | 210 | 23 |
| P9 | 100 | 360 | 40 |
| P10 | 100 | 810 | 90 |

In these pastes, mass parts of the organic vehicle 15 and mass parts of glass frits 12 were added to 100 mass parts total of the silver and copper-nickel alloy. Additionally, terpineol was used to adjust the viscosity to approximately 150 Pa·s. Screen printing was used as the method of coating. After coating by screen coating, drying was done by the transpiration of the solvent in a drying furnace at approximately 80 to 90° C. for approximately 20 minutes. The silver particle diameter in the electrically conductive paste was 0.1 to 5 µm. The copper-nickel alloy particles had a diameter of 0.5 to 6 µm, the surfaces of which were covered by silver with a thickness of 0.1 to 1.5 µm.

Next, the first main surface 2a electrodes (bus bar electrodes 3 and finger electrodes 4) were formed on the anti-reflection film 8 on the surface of the first main surface 2a side. In the formation of the bus bar electrodes 3 and the finger electrodes 4 as well, an electrically conductive paste similar to the paste containing the silver and copper-nickel alloy that formed the output lead-out electrodes 6 in each test sample cell was coated by screen printing.

After that, the electrically conductive paste coated onto the collector electrode 5 and the electrodes on the first main surface 2a were fired. This firing was performed after coating and drying the electrically conductive paste, by firing for several minutes at a maximum temperature of 500 to 600° C. within the firing furnace, and so that the oxygen concentration at a position in the vicinity of the peak temperature in the furnace was an atmosphere of 180 to 370 ppm. The output lead-out electrodes 6, the bus bar electrodes 3 and the finger electrodes 4 after the firing had a thickness of approximately 10 to 20 µm.

After the firing, the warping (height) of the test sample solar cell elements on which the output lead-out electrodes 6, the bus bar electrodes 3, and the finger electrodes 4 were formed using the above-noted pastes P1 to P10 was measured as noted below.

Figure 7:
FIG. 7 is a cross-sectional view of a solar cell element for the purpose of schematically describing the measurement of warping.

FIG. 7 is a cross-sectional view showing the warping W. That is, the warping W was measured as the height to the uppermost part of the test sample cell 12 from a flat and horizontal surface when the test sample solar cell element 12 was placed on the surface so that that it warps upward at the center.

Figure 8:
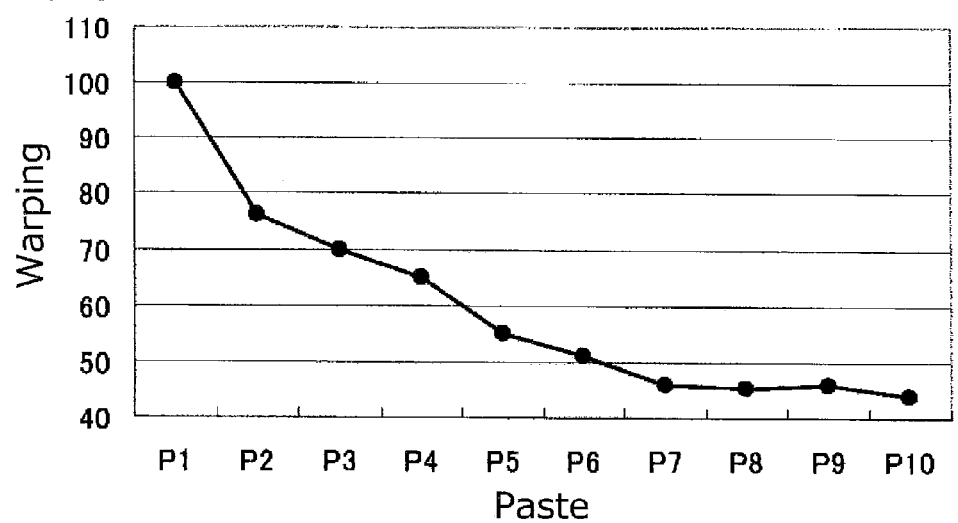
FIG. 8 is a graph showing the relationship between the type of electrically conductive paste and warping of the solar cell element.

The results of this are shown in FIG. 8. FIG. 8, with the warping of the solar cell element fabricated using the past P1 as 100, shows the warping with each of the other pastes as indices.

As shown in FIG. 8, although there was seen a reduction in the warping with pastes P2 to P7 with respect to the warping with the silver-only paste P1, there is no further reduction with pasts P8 to P10. This is thought to be because, with the pastes P8 to P10, the copper and nickel content amount is large with respect the content amount of silver, so that no further alleviation of the stress generated.

That is, it was understood that, with respect to an electrode of 100 parts by mass of silver, with a copper content of 10 or more parts by mass, by making the nickel 1 or more parts by mass, the warping of the solar cell element was reduced. Additionally, it was understood that, with copper content of 60 or more parts by mass, by making the nickel 7 or more parts by mass, the warping of the solar cell element was greatly reduced.

Also, the photovoltaic conversion efficiency of each sample cell in which the output lead-out electrodes 6, the bus bar electrodes 3, and the finger electrodes 4 had been formed using the above-noted pastes P1 to P10 were measured using simulated sunlight of AM 1.5 and 100 MW/cm$^2$ at a solar cell element surface temperature of 25° C.

Figure 9:
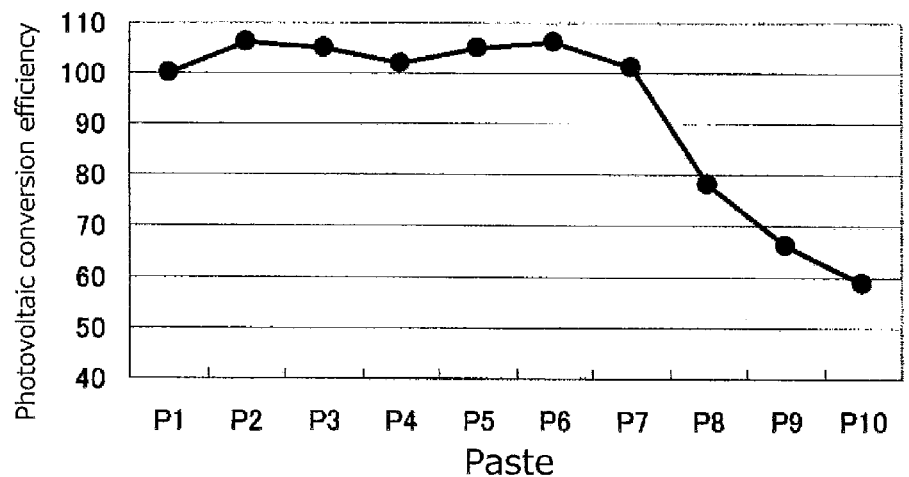
FIG. 9 is a graph showing the relationship between the type of electrically conductive paste and the photovoltaic conversion efficiency of the solar cell element.

FIG. 9 shows, with the photovoltaic conversion efficiency when using the paste P1 as 100, the photovoltaic conversion efficiencies when using each of the other pastes as indices.

As shown in FIG. 9, although there was seen an improvement in the photovoltaic conversion efficiencies with pastes P2 to P7 with respect to the photovoltaic conversion efficiency with the silver-only paste P1, pastes P8 to P10 showed a sudden decrease. This is thought to be because although the addition of copper and nickel improves the ohmic contact with the semiconductor substrate 2 of silicon and the photovoltaic conversion efficiency improves, if the amount of copper and nickel added becomes excessive the resistance increases because of copper oxidation and the effect of nickel and the like, causing a decrease in the quality of the ohmic contact.

That is, it is understood that in an electrode by making the copper content 135 or fewer parts by mass and nickel content 15 or fewer parts by mass with respect to 100 parts by mass of silver, and further preferably by making the copper content 60 to 90 parts by mass and the nickel content 7 to 10 parts by mass, the photovoltaic conversion efficiency of the solar cell element is improved.

Figure 10:
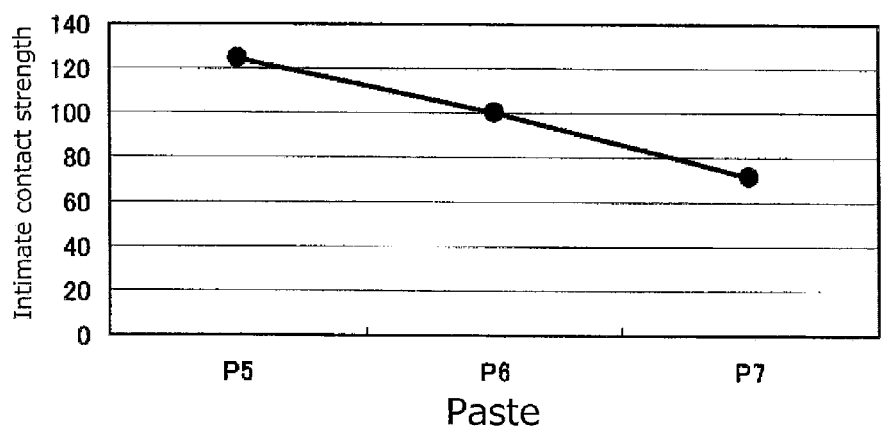
FIG. 10 is a graph showing the relationship between the type of electrically conductive paste and the intimate contact strength between the bus bar electrode and the semiconductor substrate.

Next, the results of measurements regarding the strength of intimate contact of the solar cell elements fabricated using the pastes P5, P6, and P7 are shown in FIG. 10. For this measurement, one end of ribbon-shaped lead wires approximately 5 cm in length were soldered to locations. The locations had a size of approximately 2 mm×2 mm when seen in plan view at the center parts of the center parts of the linear electrodes with respect to all three linear bus bar electrodes 3 provided on the first main surface 2a side of the solar cell element 1. After that, the ribbon-shaped lead wires were bent upward from the soldered locations at approximately 90°, the other end of the ribbon-shaped lead wires was connected to a push-pull gauge, and the push-pull gauge was pulled them upward at a rate of approximately 6 mm/minute. When this was done, the pulling load when the bus bar electrodes 3 were peeled away from the semiconductor substrate 2 was measured and the average load was calculated for each solar cell element, this being taken as the strength of the intimate contact between the bus bar electrodes 3 and the semiconductor substrate 2.

FIG. 10 shows the values for the paste P5 and the paste P7, with the value for the paste P6 taken as 100. From these measurement results, it was understood that paste P5 had the best strength of intimate contact.

From the above, when the electrodes contain by metal equivalent copper of at least 10 parts by mass and no greater than 135 parts by mass, and nickel of at least 1 part by mass and no greater than 15 parts by mass, with respect to 100 parts by mass of silver, compared to the solar cell element having electrodes made of silver only, it is possible to reduce the warping and also to manufacture a solar cell element 1 with improved photovoltaic conversion efficiency.

DESCRIPTION OF THE REFERENCE SYMBOLS 1, 21 Solar cell element
2, 25 Semiconductor substrate
2a, 21a First main surface
2b, 21b Second main surface
3 Bus bar electrode
4, 22a Finger electrode
5, 23a Collector electrode
6, 23b Output lead-out electrode
7 Removed part
8, 27 Anti-reflection film
9, 26 Opposite-conductivity type layer (semiconductor layer)
10 p-type bulk region
22b Through hole electrode
22c First electrode
23 Second electrode
24 Third electrode
26a First opposite-conductivity type layer
26b Second opposite-conductivity type layer
26c Third opposite-conductivity type layer
28 Electrode through hole
29a, 29b Separation trench
30 High-concentration doped layer
31, 33 First metal region
32, 34 Second metal region

The invention claimed is:

1. A solar cell element, comprising:
a semiconductor substrate comprising:
    a body; and
    a first layer on the body, having a different conductivity type from that of the body, and
the semiconductor substrate also comprising:
    a first main surface positioned at a side opposite to the body; and
    a second main surface positioned at a side opposite to the first main surface; and
electrodes for extracting generated electric power, comprising:
    first electrodes that are disposed on the first layer; and
    second electrodes that are disposed on the second main surface,
    wherein at least one of the first electrodes and the second electrodes comprises silver, copper and nickel as a main component,
    wherein with respect to 100 parts by mass of silver, the electrodes contain at least 60 parts by mass and not greater than 90 parts by mass of copper and at least 7 parts by mass and not greater than 10 parts by mass of nickel.

2. The solar cell element according to claim 1, wherein the electrodes comprise a plurality of first metal regions comprising a copper-nickel alloy as a main component and a second metal region surrounding each of the first metal regions and comprising silver as a main component.

3. The solar cell element according to claim 1, wherein the electrodes comprise a first metal region comprising copper as a main component and a second metal region comprising silver and nickel as a main component.

4. The solar cell element according to claim 1, wherein only the second electrodes of the electrodes comprise silver, copper, and nickel as the main component.

5. The solar cell element according to claim 1, wherein the first electrodes are disposed on only the first main surface.

6. The solar cell element according to claim 1, wherein the semiconductor substrate further comprises a second layer having a same conductivity type as that of the first layer, and the body is sandwiched between the first layer and the second layer.

7. The solar cell element according to claim 6, further comprising:
a plurality of through holes that pass through between the first main surface and the second main surface;
and a plurality of conductors disposed within the through holes,
wherein the conductors contact inner walls of the through holes of the first layer and the second layer, and
    wherein the first electrodes lead out to the second main surface as well via the conductors.

8. The solar cell element according to claim 7, wherein the conductors comprise silver, copper and nickel as a main component.

9. A method for manufacturing a solar cell element, comprising:
preparing an electrically conductive paste containing silver, copper and nickel and a semiconductor substrate comprising a body and a first layer on the body, having a different conductivity type from that of the body;
applying the electrically conductive paste on the semiconductor substrate; and
firing the electrically conductive past to form the solar cell element according to claim 1.

10. The method for manufacturing the solar cell element according to claim 9, wherein the electrically conductive paste comprises copper-nickel alloy particles and silver.

11. The method for manufacturing the solar cell element according to claim 10, wherein the electrically conductive paste comprises copper-nickel alloy particles, the surfaces of which are covered by silver.

12. The method for manufacturing the solar cell element according to claim 9, wherein the electrically conductive paste comprises copper particles, the surfaces of which are covered by nickel, and silver.

13. The method for manufacturing the solar cell element according to claim 9, wherein the electrically conductive paste comprises copper particles, the surfaces of which covered by silver, and nickel.

* * * * *